United States Patent
Zeng et al.

(10) Patent No.: US 7,679,473 B2
(45) Date of Patent: Mar. 16, 2010

(54) LOW PASS FILTER INCORPORATING COUPLED INDUCTORS TO ENHANCE STOP BAND ATTENUATION

(75) Inventors: Wenjiang Zeng, Sunnyvale, CA (US); Rong Liu, Fremont, CA (US); Yupeng Chen, Sunnyvale, CA (US); Wang-Chang Albert Gu, Longwood, FL (US)

(73) Assignee: California Micro Devices, Milpitas, CA (US)

( * ) Notice: Subject to any disclaimer, the term of this patent is extended or adjusted under 35 U.S.C. 154(b) by 40 days.

(21) Appl. No.: 12/014,725

(22) Filed: Jan. 15, 2008

(65) Prior Publication Data

US 2009/0179713 A1  Jul. 16, 2009

(51) Int. Cl.
*H03H 7/00* (2006.01)
(52) U.S. Cl. .................................... 333/176; 333/167
(58) Field of Classification Search ......... 333/167–172, 333/174–176
See application file for complete search history.

(56) References Cited

U.S. PATENT DOCUMENTS

| | | | |
|---|---|---|---|
| 4,577,168 A | | 3/1986 | Hartmann |
| 5,157,362 A | * | 10/1992 | Zelenz .................. 333/175 |
| 6,788,168 B2 | * | 9/2004 | Guitton et al. .............. 333/170 |
| 7,327,207 B2 | * | 2/2008 | Asakawa ..................... 333/175 |
| 2002/0141570 A1 | | 10/2002 | Sun et al. |
| 2003/0042991 A1 | | 3/2003 | Cotant et al. |
| 2006/0132257 A1 | | 6/2006 | Wang et al. |
| 2006/0244478 A1 | * | 11/2006 | Smith et al. ................... 326/27 |

OTHER PUBLICATIONS

Selmi, et al., "Design of an X-Band Transformer-Coupled Amplifier with Improved Stability and Layout", *IEEE J. of Solid State Cir.*, 28:6, 1993, pp. 701-703.
Mohan, et al., "Modeling and Characterization of On-Chip Transformers", *Center for Integrated Systems*, Stanford University, appearing in *Electron Devices Meeting*, IEDM 1998 Technical Digest, Dec. 6-9, 1998, pp. 1-4.

* cited by examiner

*Primary Examiner*—Robert Pascal
*Assistant Examiner*—Kimberly E Glenn
(74) *Attorney, Agent, or Firm*—Pillsbury Winthrop Shaw Pittman LLP

(57) ABSTRACT

The present invention relates to a low pass filter incorporating coupled inductors to enhance stop band attenuation. In one embodiment, the coupled inductors are provided along with various capacitors to provide for superior performance within a smaller surface area of a semiconductor or ceramic integrated device. In a further specific embodiment, the capacitors are formed on an integrated device within an area on which entirely intertwined inductors are formed. In another embodiment, at least one further pair of coupled inductors is included to create additional frequency attenuation notches, as well as a wide stop-band.

28 Claims, 12 Drawing Sheets

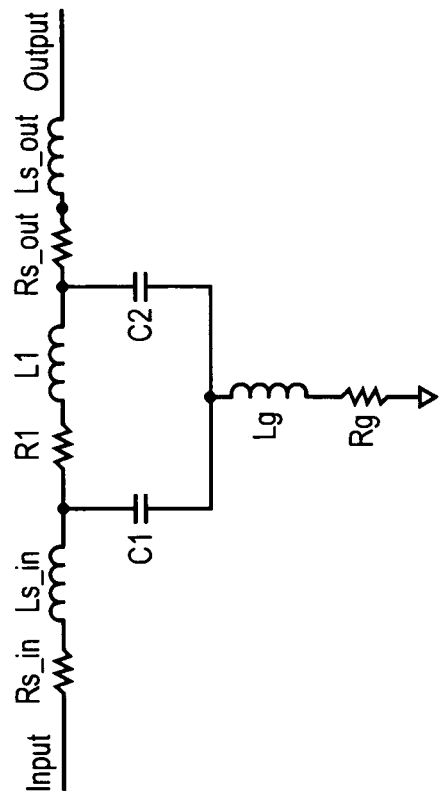
FIG. 1(b)1
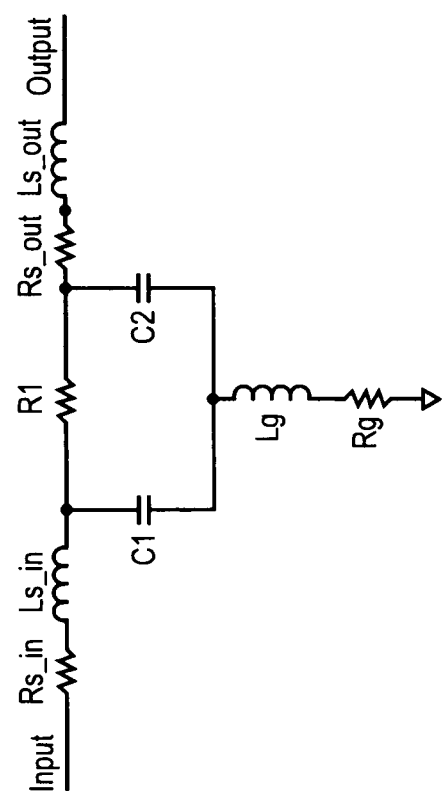
FIG. 1(a)1
PRIOR ART

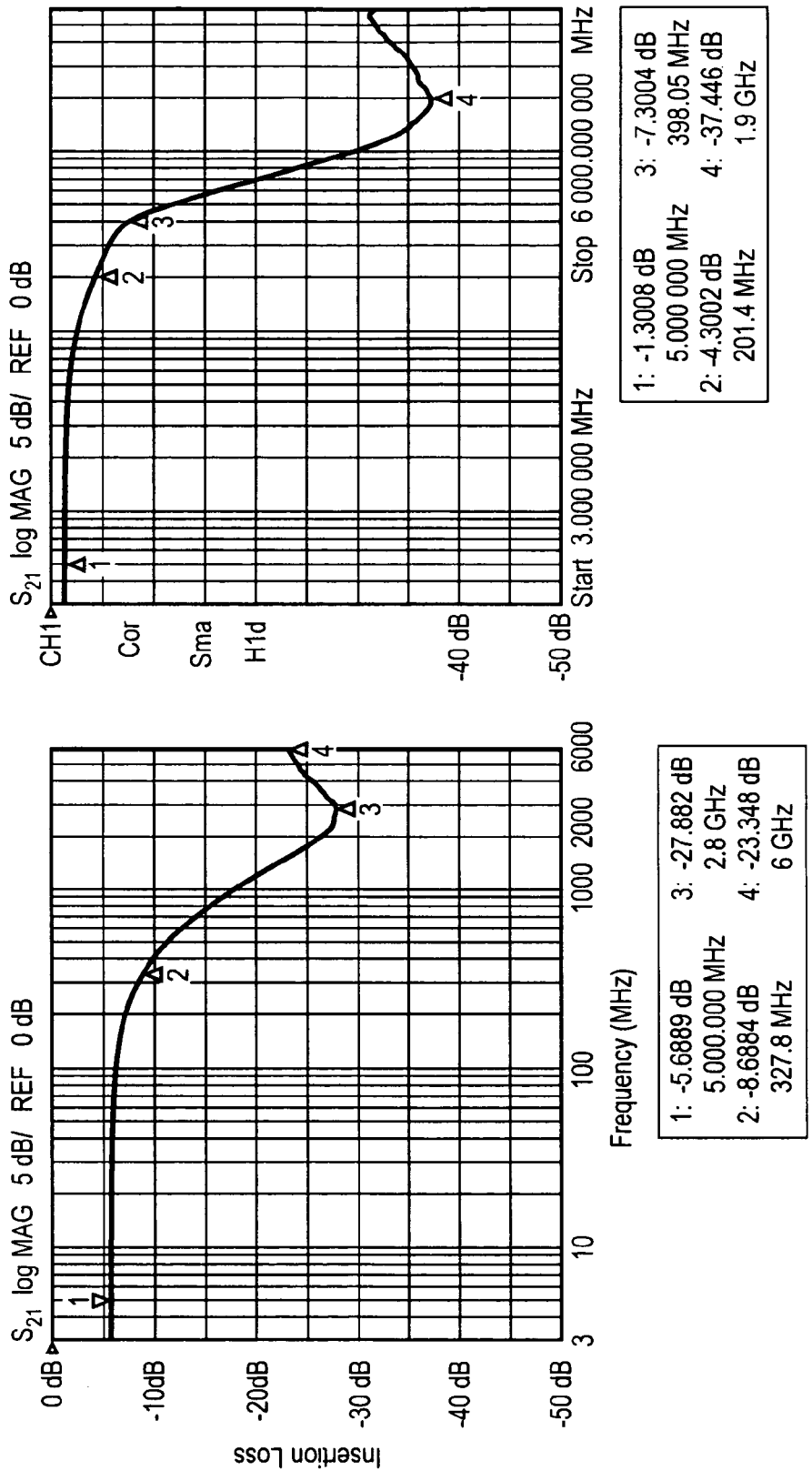
FIG. 1(b)2
FIG. 1(a)2
PRIOR ART

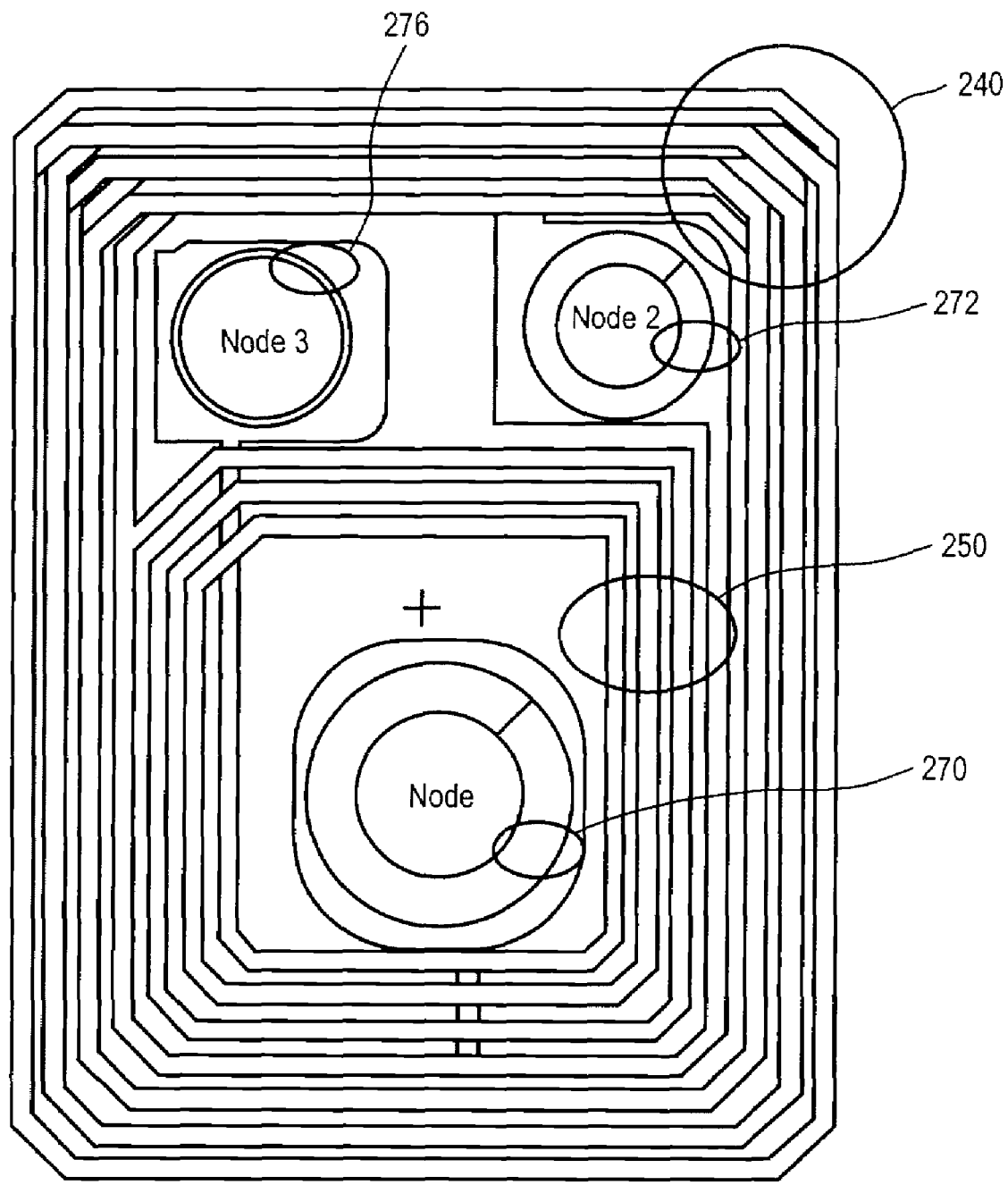
FIG. 2(b)1

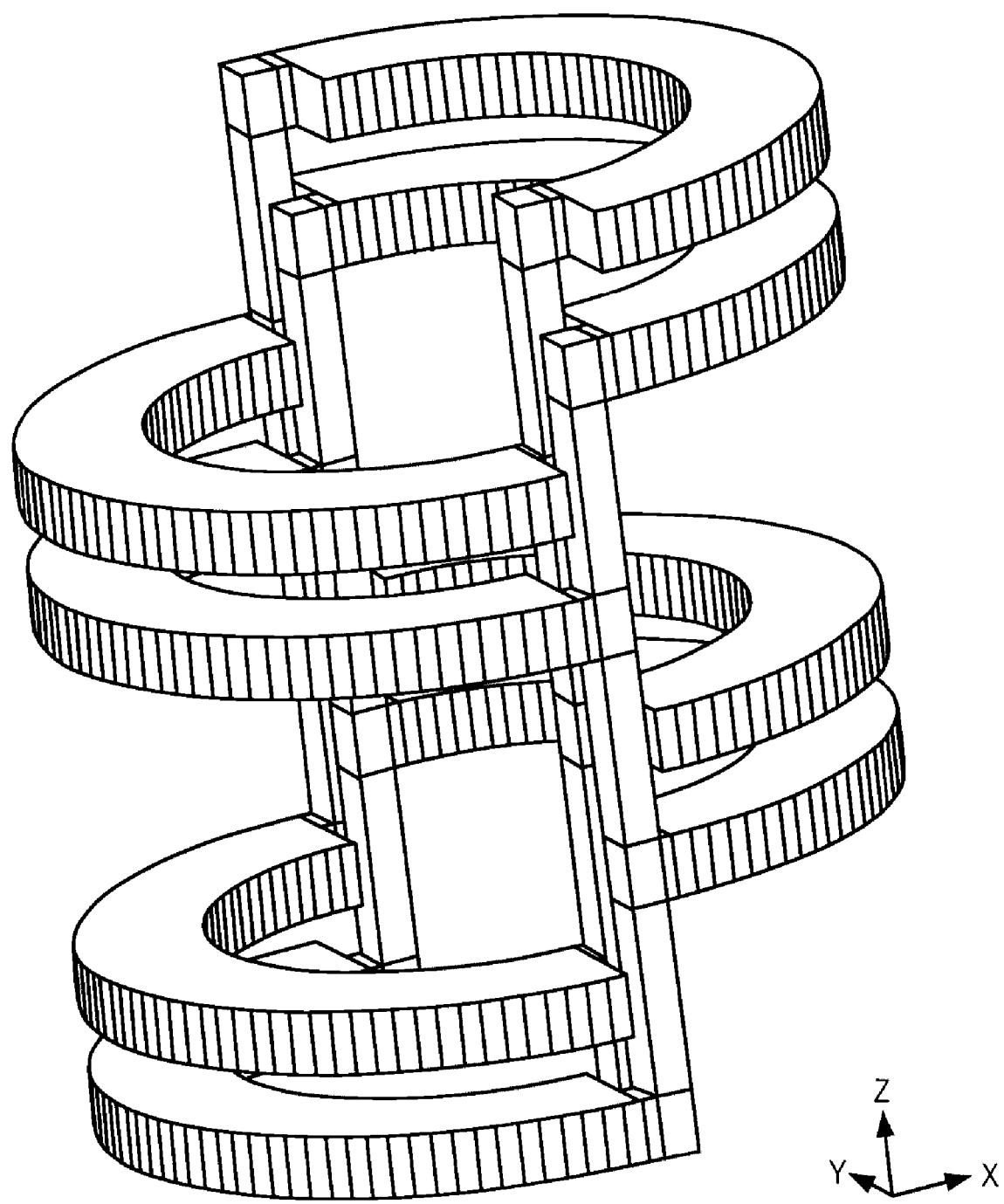
FIG. 2(b)2

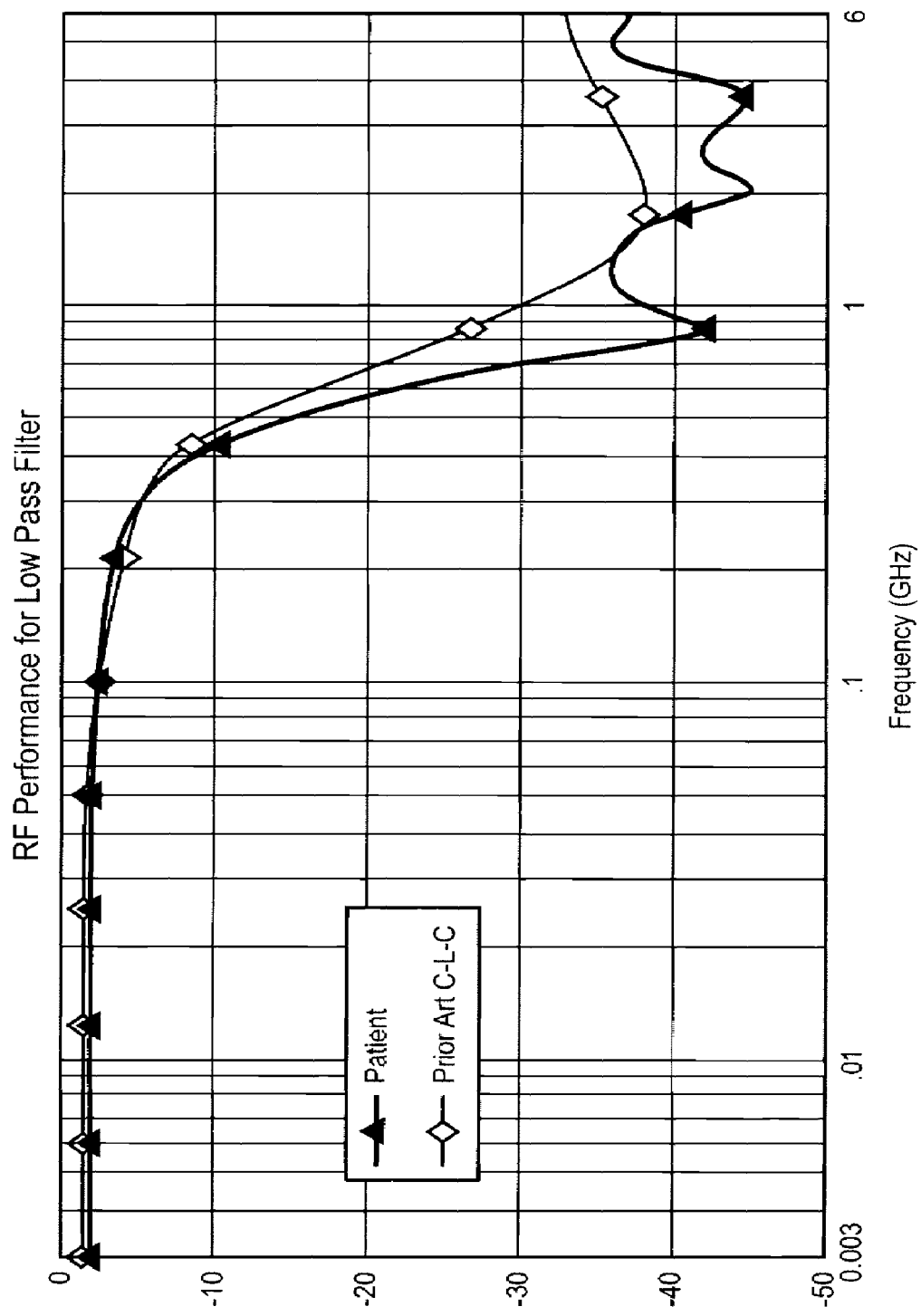

LOW PASS FILTER INCORPORATING COUPLED INDUCTORS TO ENHANCE STOP BAND ATTENUATION

FIELD OF THE INVENTION

The present invention relates to a low pass filter incorporating coupled inductors to enhance stop band attenuation.

BACKGROUND OF THE INVENTION

Filter circuits that provide stop band attenuation are well-known. On such type of circuit is a notch circuit, that filters frequencies from a certain portion of the frequency spectrum (corresponding to the notch), and allows other frequencies to pass. FIGS. 1(a) 1-2 and 1(b) 1-2 illustrate a conventional prior art C-R-C and C-L-C low pass filtering circuits, respectively, as well as their respective performance characteristics. As shown, they provide a stop band at about 800 MHz to 6 GHz, which covers the radio frequency range used for wireless communication. A steep roll off from pass band to stop band frequency is highly desired, especially when high speed signals are incorporated in these devices.

The present invention a circuit that provides desired stop-band performance in smaller areas, as well as less attenuation of the lower frequencies that are desired.

SUMMARY OF THE INVENTION

The present invention relates to a low pass filter incorporating coupled inductors to enhance stop band attenuation.

In one embodiment, the coupled inductors are provided along with various capacitors to provide for superior performance within a smaller surface area of a semiconductor or ceramic integrated device.

In a further specific embodiment, the capacitors are formed on an integrated device within an area on which entirely intertwined inductors are formed.

In another embodiment, at least one further pair of coupled inductors is included to create additional frequency attenuation notches, as well as a wide stop-band.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein:

FIGS. 1(a) 1-1 and 1(b) 1-1 illustrate a conventional prior art circuit, and FIGS. 1(a)-2 and 1(b)-2 provide the frequency domain filter performance.

FIG. 2(B)1-2 illustrates a layout of the coupled inductor circuit according to FIG. 2(a) of the present invention.

FIG. 2(d) illustrates a performance comparison between an embodiment of the present invention and a conventional C-L-C filter.

DETAILED DESCRIPTION OF THE PREFERRED EMBODIMENTS

The present invention is preferably implemented on a single integrated circuit, as is described herein. The invention is used as a filter in order filter various different frequencies, including noise as well as upper harmonics of clock frequencies, particularly in frequency bands of interest such as 850 MHz. Wide passband is important for signal integrity as it is preferred to have as many harmonics as possible to pass through to preserve the waveform. In order to filter out any un-wanted signal, a wide stopband is important.

What is the frequency range of un-wanted signal highly relies on application. In cell phone applications, for instance, other than the audio filter a stopband from 0.8 GHz to 6 GHz is desired, which corresponding to mobile frequency range (GSM and CDMA 0.8 GHz-0.9 GHz, 1.8 GHz-2 GHz, Bluetooth 2.4 GHz-2.5 GHz, wireless LAN 2.4 GHz-2.5 GHz, 5.15 GHz-5.350 GHz, 5.725 GHz-5.825 GHz). The WiMax band of 2-11 GHz is also of interest.

In a typical application, the data that is being preserved is that digital data with a data rate which increases. Typically it is up to 70 Mbit/s—and the 5th harmonic frequency of such a data rate is 350 MHz, which signal needs to pass through.

Figure 2A:
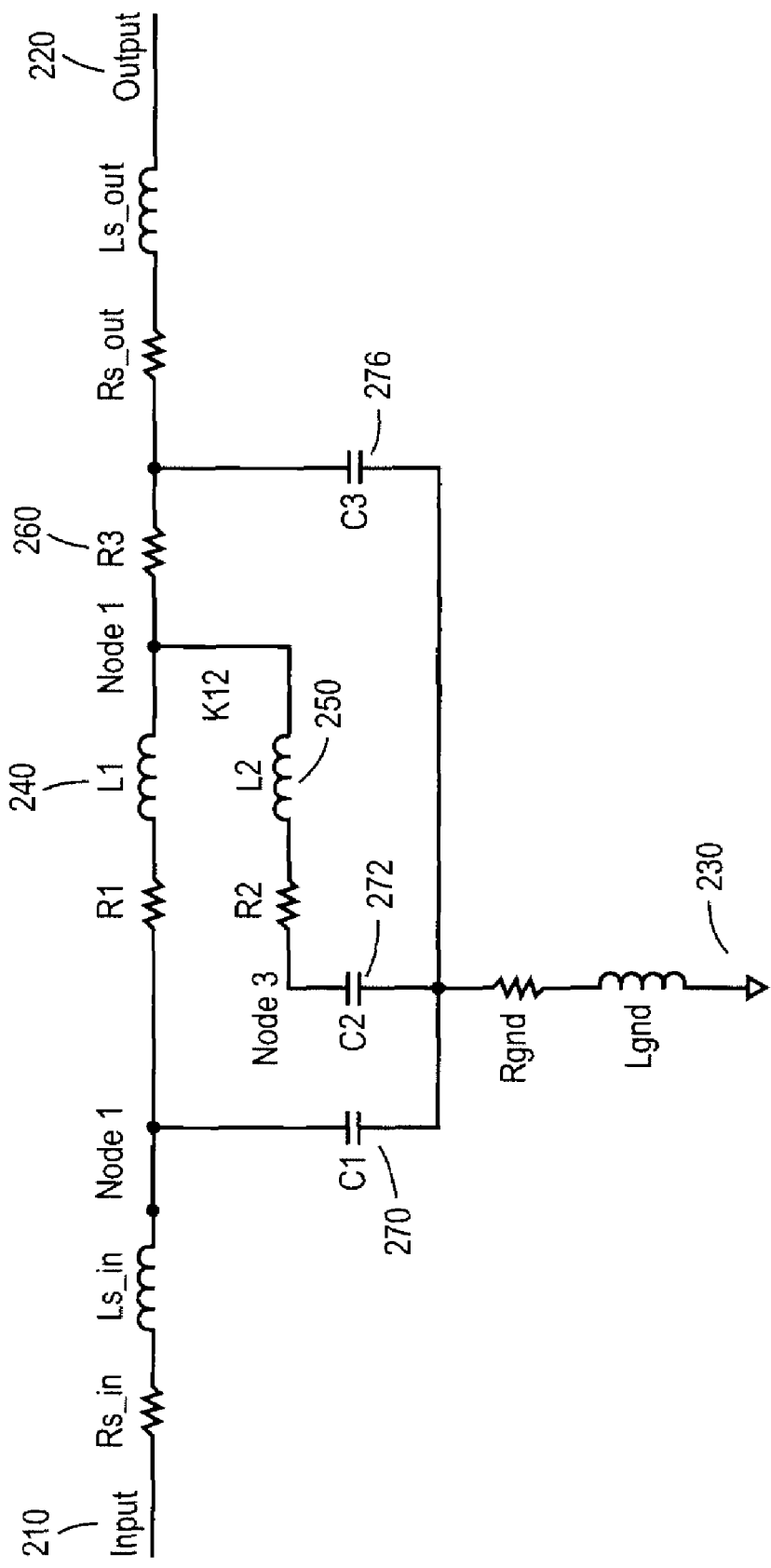
FIG. 2(a) illustrates an embodiment of a coupled inductor notch circuit according to the present invention.

FIG. 2(a) illustrates an embodiment of a coupled inductor notch circuit 200 according to the present invention. As shown, the circuit includes an input 210, an output 220, and a ground 230, each of which, as shown, have associated therewith a parasitic resistance and a parasitic inductance. Coupled inductors 240 and 250, each having a parasitic resistance associated therewith as shown, are connected between nodes 1, 2 and 3 as shown, with inductor 240 being in series with resistor 260 between the input 210 and the output 220, and inductor 250 being in series with capacitor 272 between node 2 and ground 230, with node 2 being the node between inductor 250 and capacitor 272. Capacitors 270 and 276 are connected between node 1 and ground and output 230 and ground, respectively, as shown. An example of values for the circuit elements is provided in the Table 1 below for the FIG. 2(a) column.

TABLE 1

Figure 3A:
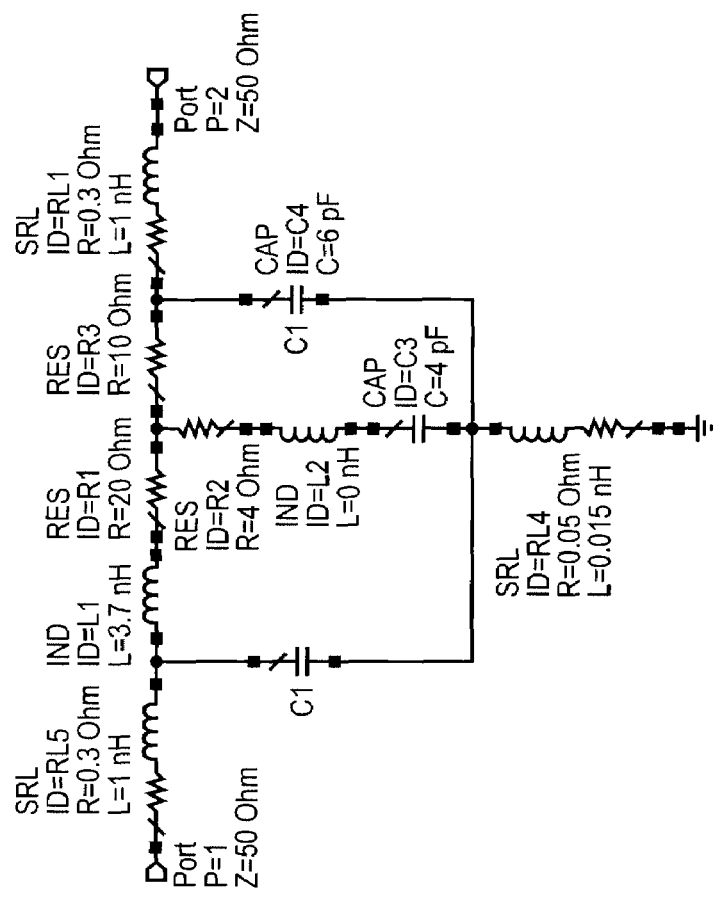
FIGS. 3(a)-(c) illustrates a circuit that uses inductors that are uncoupled, a performance curve for the circuit, and a physical layout of the circuit.

|  | FIG. 2(a) | FIG. 2(d) | FIG. 3(a) |
|---|---|---|---|
| input 210 resistance | 0.3 ohm | 0.3 ohm | 0.3 ohm |
| input 210 inductance | 1 nH | 1 nH | 1 nH |
| output 220 resistance | 0.3 ohm | 0.3 ohm | 0.3 ohm |
| output 220 inductance | 1 nH | 1 nH | 1 nH |
| ground 230 resistance | 0.05 ohm | 0.05 ohm | 0.05 ohm |
| ground 230 inductance | 15 pH | 15 pH | 15 pH |

TABLE 1-continued

|  | FIG. 2(a) | FIG. 2(d) | FIG. 3(a) |
|---|---|---|---|
| inductor 240 | 24 nH; 15 ohm | 240 nH; 50 ohm | 37 nH; 20 ohm |
| inductor 250 | 3.5 nH; 6 ohm | 34 nH; 15 ohm | 9.0 nH; 4 ohm |
| resistor 260 | 26 ohm | | 10 ohm |
| capacitors 270 | 15 pF | 145 pF | 17 pF |
| capacitor 272 | 2.5 pF | 20 pF | 4 pF |
| capacitor 274 | 10 pF | 140 pF | 6 pF |

FIG. 2(b)1 illustrates a layout of the coupled inductor circuit according to FIG. 2(a) of the present invention. As is shown inductors 240 and 250 are coupled, such that the coils of inductor 240 overlap with the coils of inductor 250. The number and size of the coils in inductors 240 and 250 will depend on the application requirements, such as filter passband and stop-band frequencies, current handling capability and resistance requirements. FIG. 2(b)2 shows an example configuration of a spiral inductor that can be used according to the present invention in a multi-layer structure.

Figure 2C:
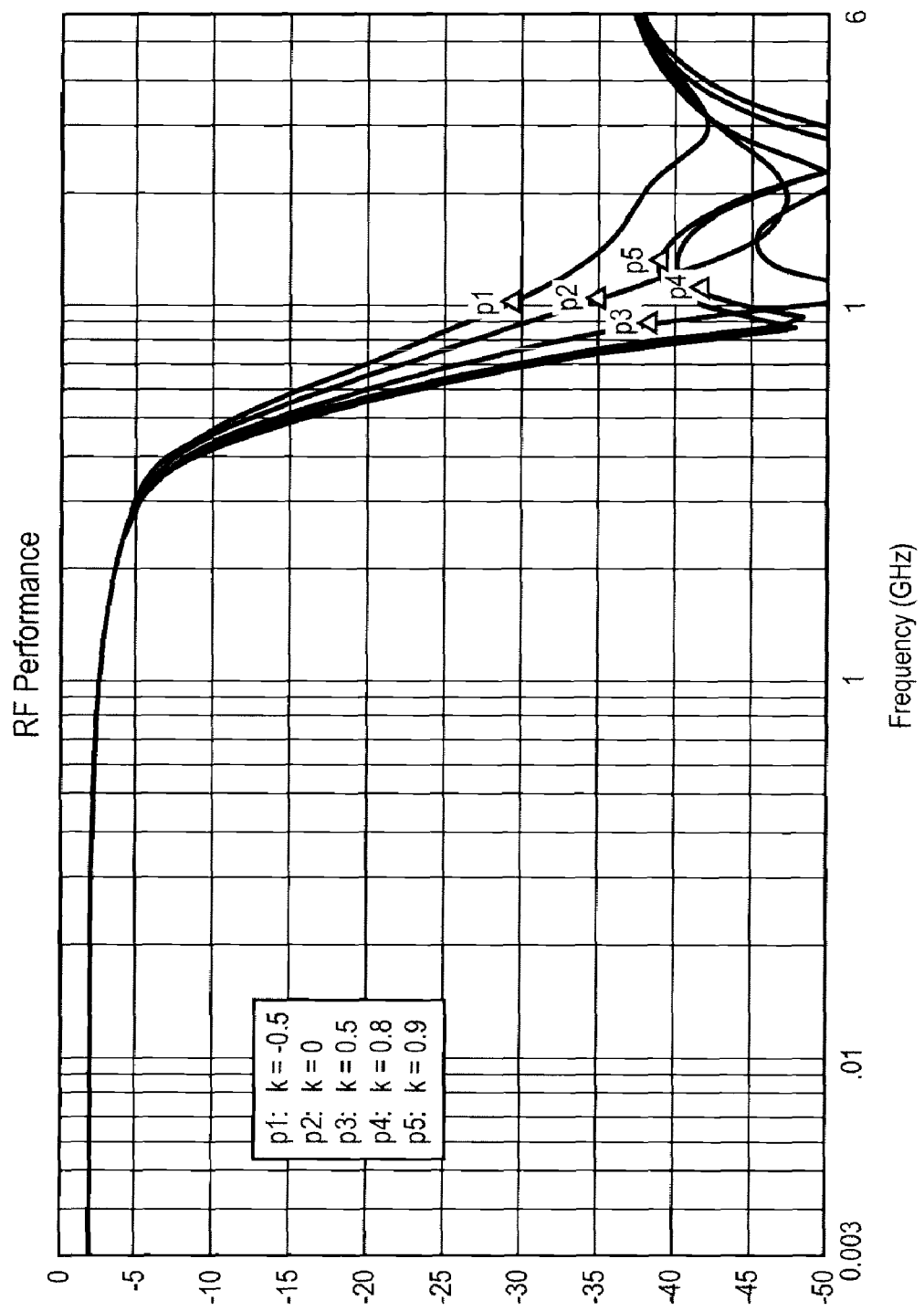
FIG. 2(c) illustrates performance characteristics at different coupling ratios, respectively, according to the present invention.

FIG. 2(c) illustrates performance characteristics at different coupling ratios, respectively, according to the present invention. As is shown, depending upon the degree of overlap (coupling coefficient K) the performance of the circuit changes with fixed inductor size. Degree of overlap is most significant with respect to the surface area of the coils that overlap, with coils that are intertwined but on separate planes having the most overlap, and the amount of the separation between the planes of the coils having an effect, but a secondary effect, on the coupling coefficient K. The coupling coefficient K, as is known, will depend on the degree of shared magnetic field of the two inductor coils. In a preferred embodiment, in addition to being entirely intertwined, the coils of inductors 240 and 250 are preferably positioned to that there the coils of one inductor are positioned in gaps between the coils of the other inductor, thereby avoiding surface alignment of the coils and minimizing parasitic capacitance between them. When entirely intertwined, the typical coefficient coupling K is in the range of 0.3-0.9.

FIG. 2(d) illustrates a performance comparison between an embodiment of the present invention and a conventional C-L-C filter. The steep attenuation and the initial notch that has greater attenuation than the conventional C-L-C circuit are noticeable and advantageous characteristics.

Figure 2E:
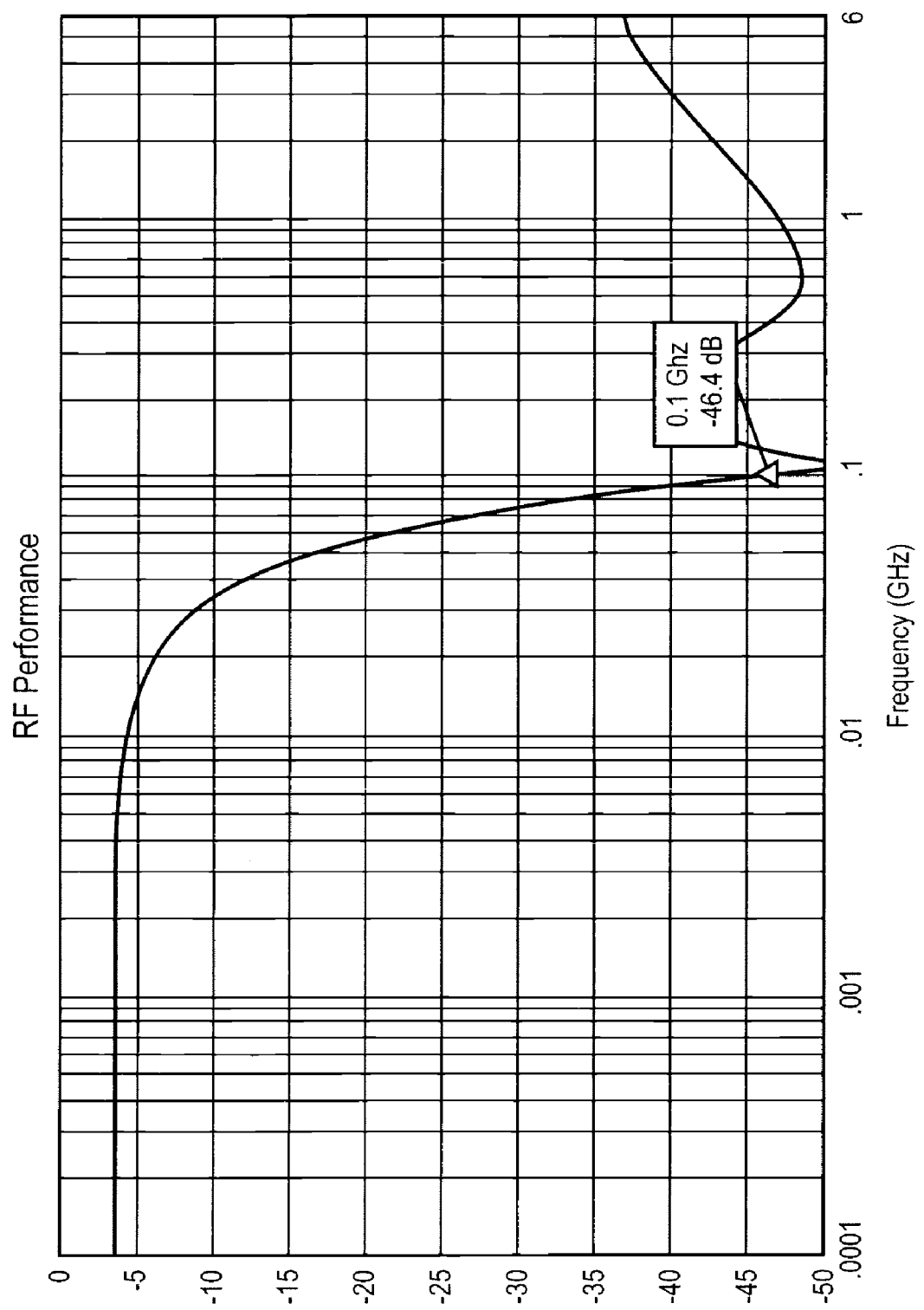
FIG. 2(e) illustrates performance characteristics at a different notch frequency using the same circuit topology as in FIG. 2(a), according to the present invention.

FIG. 2(e) illustrates performance characteristics at a different notch frequency using the same circuit topology as in FIG. 2(a), according to the present invention. The circuit values for this stop band frequency are provided in the Table 1 above.

Figure 3B:
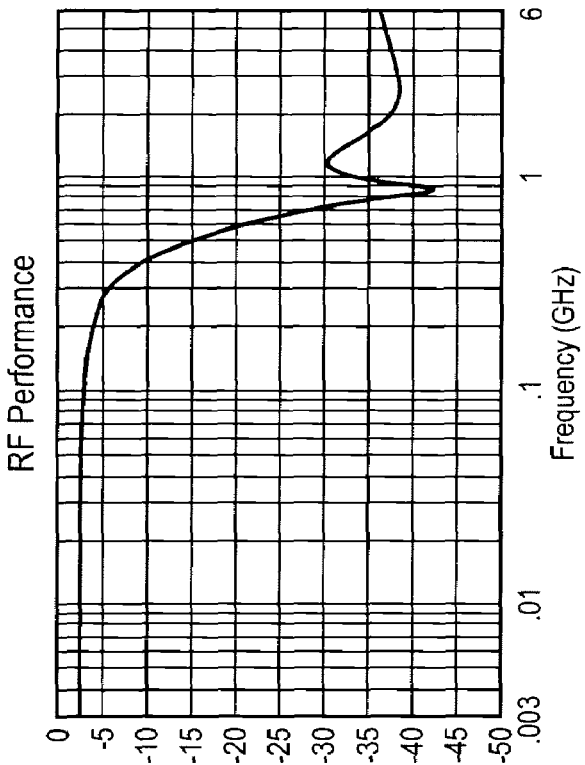
Figure 3C:
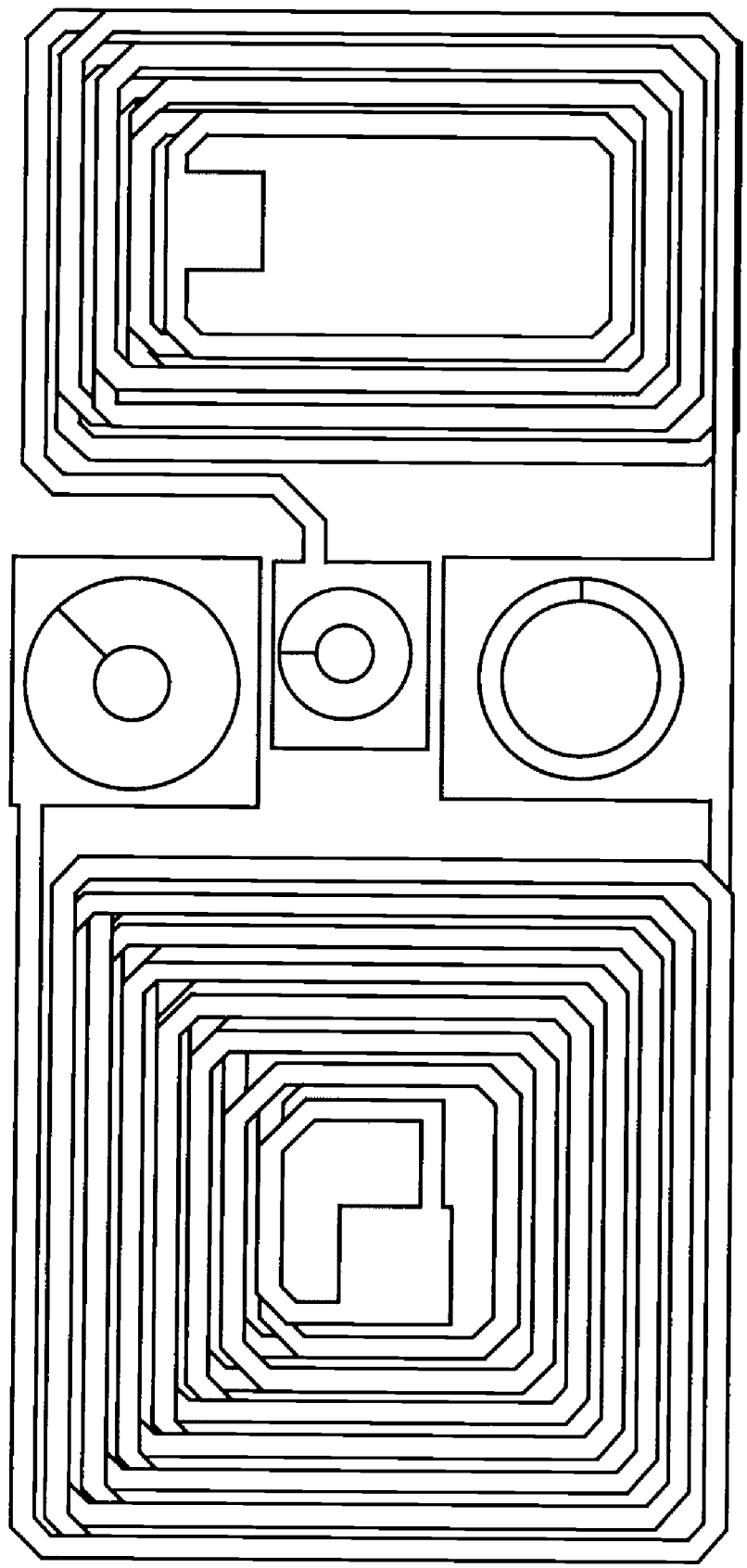

FIGS. 3(a)-(b) illustrates the same circuit as in FIG. 2(a), other than that the inductors 240 and 250 are uncoupled, and as such FIG. 3(a) shows the performance curve for the circuit, and a physical layout of the circuit is shown in FIG. 3(b). The circuit values for this comparison circuit are provided at Table 1 above as well. This circuit occupies a significantly larger area, as there is a non-overlapping inductor layout, and there is also a larger self-inductance value for each of the inductors 240 and 250.

Figures 4A, 4B:
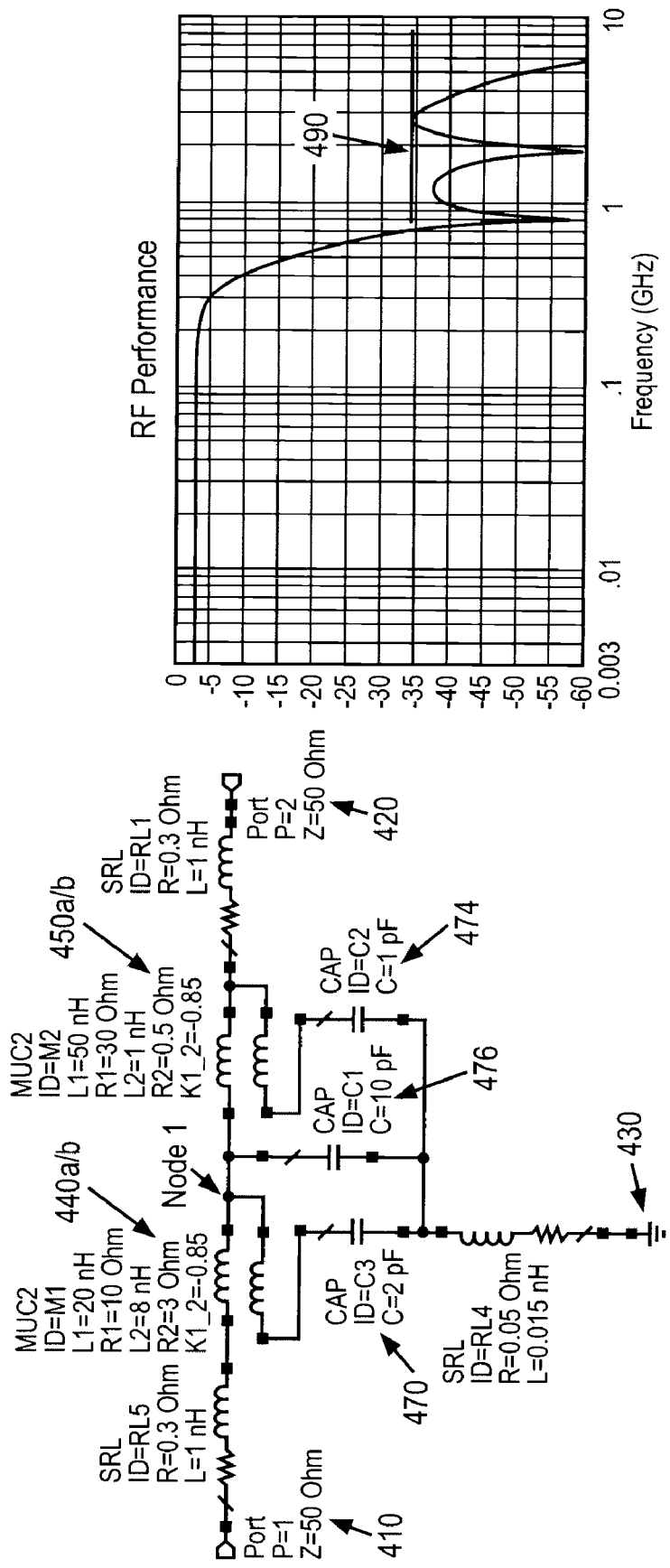
FIGS. 4(a)-(b) illustrate another embodiment of a coupled notch circuit according tot the present invention that has multiple notches and the performance characteristics associated therewith.

FIGS. 4(a)-(b) illustrate another embodiment of a coupled notch circuit according to the present invention that has multiple notches and the performance characteristics associated therewith. Circuit elements are identified in FIG. 4(a), with an input 410, an output 420, and a ground 430, each of which, as shown, have associated therewith a parasitic resistance and a parasitic inductance. One of the inductors 440a and 450a within the coupled inductors pairs 440a/b and 450a/b, each having a parasitic resistance associated therewith, are connected between the input 410 and the output 420, and connected together at Node 1. The other inductor 440b is connected between node 1 and the ground, in series with capacitors 470; the inductor 450b is connected between output and the ground, in series with capacitors 474; while capacitor 476 is directly connected between Node 1 and ground 430. An example of values for the circuit elements is provided in the Table 2.

TABLE 2

|  | FIG. 4(a) |
|---|---|
| input 410 resistance | 0.3 ohm |
| input 410 inductance | 1 nH |
| output 420 resistance | 0.3 ohm |
| output 420 inductance | 1 nH |
| ground 430 resistance | 0.05 ohm |
| ground 430 inductance | 15 pH |
| inductor 440a | 20 nH; 10 ohm |
| inductor 440b | 8 nH; 3 ohm |
| inductor 450a | 50 nH; 30 ohm |
| inductor 450b | 1 nH; 0.5 ohm |
| capacitor 270 | 2 pF |
| capacitor 272 | 10 pF |
| capacitor 274 | 1 pF |

In this embodiment, which is also referred to as a 5-pole circuit, rather than the 3 pole circuit of FIG. 2(a), different filtering characteristics are achieved. In addition to more notches to substantially attenuate the frequencies corresponding to the notches, as well as creates a wide stop-band corresponding to the line 490 that shows attenuation of at least the corresponding predetermined dB amount as shown by the use of additional notches.

Figures 5A, 5B:
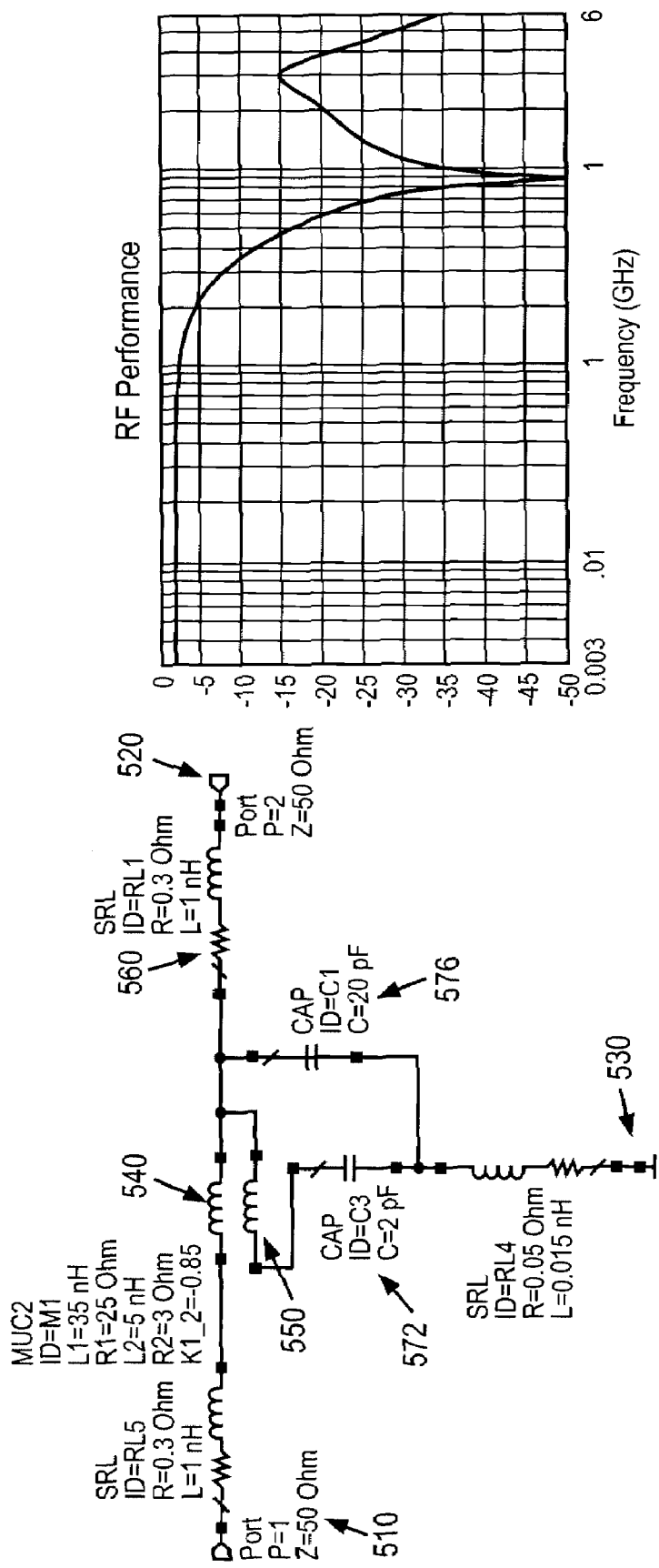
FIG. 5(a) illustrates an embodiment of a coupled inductor notch circuit 500 according to the present invention, and FIG. 5(b) the performance curve.

FIG. 5(a) illustrates an embodiment of a coupled inductor notch circuit 500 according to the present invention, and FIG. 5(b) the performance curve. As shown, the modification is an a L-C filter (instead of C-L-C) using the same concept of coupled inductors to enhance stopband performance. Although the performance of this circuit is not as good as C-L-C filter of FIG. 2(a) with notch, it can be used within the context and scope of the present invention. As shown, the circuit includes an input 510, an output 520, and a ground 530, each of which, as shown, have associated therewith a parasitic resistance and a parasitic inductance. Coupled inductors 540 and 550, each having a parasitic resistance associated therewith as shown, with inductor 540 being in series with resistor 560 between the input 510 and the output 520, and inductor 550 being in series with capacitor 572. Capacitors 576 is also connected between output 520 and ground, respectively, as shown. An example of values for the circuit elements is provided in the Figure.

The present invention allows for significant space savings in discrete semiconductor filter circuits, which may or may not also include ESD protection, as well as in circuits formed on multi-layer technologies, which include not only semiconductor technologies, but also ceramic technologies and others. The inductor, in addition to being formed in a planar manner as shown, can also be spiral or other configurations.

Although the present invention has been particularly described with reference to embodiments thereof, it should be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated in the above figures. It is intended that the scope of the appended claims include such changes and modifications.

What is claimed:

1. A filter circuit disposed between an input line, an output line, and a ground line, each of the input line, the output line and the ground line each having a parasitic resistance and a parasitic inductance associated therewith, the filter circuit comprising:
   a first inductor having first coils disposed in series with a first resistor between the input line and the output line, wherein a first node is created between the first inductor and the first resistor;
   a second inductor having second coils and a first capacitor disposed in series between the first node and the ground line, wherein the second coils of the second inductor at least partially overlap with the first coils of the first inductor, thereby coupling the first and second inductors and reducing a surface area occupied by the first and the second inductors; and
   a second capacitor disposed between the output line and the ground line;
wherein the filter circuit has a predetermined stop-band, a predetermined pass-band cutoff frequency, and wherein the first and second inductors and the first and second capacitors steepen a slope of the roll-off and provide a notch at a stop-band frequency to obtain substantial attenuation beyond the cutoff frequency and minimum attenuation below the cutoff frequency.

2. The filter circuit according to claim 1 wherein the predetermined stop-band is provided between 800-950 MHz.

3. The filter circuit according to claim 1 wherein the predetermined stop-band is provided between 1.8-1.9 GHz.

4. The filter circuit according to claim 1 wherein the overlap between the first and the second inductors results in the first and the second inductors being entirely intertwined.

5. The filter circuit according to claim 1, wherein each of the first and second capacitors, the first and second inductors, and connections therebetween are formed on an integrated device that has multiple layers.

6. The filter circuit according to claim 5 wherein the overlap between the first and the second inductors results in the first and the second inductors being entirely intertwined.

7. The filter circuit according to claim 6 wherein the first and second inductors are further formed so that the first inductor coils are positioned in gaps between the second inductor coils, thereby avoiding surface alignment of the first and second inductor coils and minimizing parasitic capacitance between the first and second inductors.

8. The filter circuit according to claim 7 wherein the first and second inductors are planar and are formed on different layers of the integrated device.

9. The filter circuit according to claim 8 wherein the first and the second capacitors are each formed within a surface area of the first and the second inductors.

10. The filter circuit according to claim 5 wherein the integrated device is a semiconductor device.

11. The filter circuit according to claim 10 the predetermined stop-band is provided between at least one of 800-950 MHz and 1.8-1.9 GHz.

12. The filter circuit according to claim 5 wherein the integrated device is a ceramic device.

13. The filter circuit according to claim 12 wherein the predetermined stop-band is provided between at least one of 800-950 MHz and 1.8-1.9 GHz.

14. The filter circuit according to claim 1 further including:
   a third inductor having third coils disposed between the input line and the first inductor; and
   a fourth inductor having fourth coils and having one end disposed between a node formed by the first inductor and the third inductor, and another end connected to the first capacitor,
wherein the third coils of the third inductor at least partially overlap with the fourth coils of the fourth inductor, thereby coupling the third and fourth inductors, reducing a surface area occupied by the third and the fourth inductors and creating a further attenuation frequency notch.

15. The filter circuit according to claim 14 wherein the third and fourth inductors, along with the first and second inductors and the first and the second capacitors create a wide stop-band corresponding to a predetermined attenuation amount.

16. The filter circuit according to claim 14, wherein each of the first and second capacitors, the first, second, third and fourth inductors, and connections therebetween are formed on an integrated device that has multiple layers.

17. The filter circuit according to claim 16 wherein the overlap between the first and the second inductors results in the first and the second inductors being entirely intertwined and the overlap between the third and the fourth inductors results in the third and the fourth inductors being entirely intertwined.

18. The filter circuit according to claim 17 wherein:
   the first and second inductors are further formed so that the first inductor coils are positioned in gaps between the second inductor coils, thereby avoiding surface alignment of the first and second inductor coils and minimizing parasitic capacitance between the first and second inductors; and
   the third and fourth inductors are further formed so that the third inductor coils are positioned in other gaps between the fourth inductor coils, thereby avoiding surface alignment of the third and fourth inductor coils and minimizing parasitic capacitance between the third and fourth inductors.

19. The filter circuit according to claim 18 wherein the first and second inductors are planar and are formed on different layers of the integrated device; and
   wherein the third and fourth inductors are planar and are formed on different layers of the integrated device.

20. The filter circuit according to claim 18 further including a third capacitor disposed between the input line and the ground line.

21. The filter circuit according to claim 20, wherein each of the first, second and third capacitors, the first, second, third and fourth inductors, and connections therebetween are formed on an integrated device that has multiple layers.

22. The filter circuit according to claim 20, wherein each of the first, second and third capacitors, the first, second, third and fourth inductors, and connections therebetween are formed on an integrated device that has multiple layers.

23. The filter circuit according to claim 17 wherein the first and second capacitors are each formed within a surface area of the first, second, third and fourth inductors.

24. The filter circuit according to claim 16 wherein the integrated device is a semiconductor device.

25. The filter circuit according to claim 24 wherein the predetermined stop-band is provided between at least one of 800-950 MHz and 1.8-1.9 GHz.

26. The filter circuit according to claim 24 wherein the predetermined stop-band is provided between at least one of 800-950 MHz and 1.8-1.9 GHz.

27. The filter circuit according to claim 16 wherein the integrated device is a ceramic device.

28. The filter circuit according to claim 1 further including a third capacitor disposed between the input line and the ground line.

* * * * *